US008333005B2

(12) United States Patent

LaGrotta et al.

(10) Patent No.: US 8,333,005 B2
(45) Date of Patent: Dec. 18, 2012

(54) METHOD OF CONSTRUCTING A TUNABLE RF FILTER

(75) Inventors: James Thomas LaGrotta, Boonton, NJ (US); Richard T. LaGrotta, Livingston, NJ (US)

(73) Assignees: James Thomas Lagrotta, Boonton, NJ (US); Richard T. Lagrotta, Livingston, NJ (US); Thomas Lagrotta, Thornwood, NY (US); Manuel Orellana, Long Valley, NJ (US)

( * ) Notice: Subject to any disclaimer, the term of this patent is extended or adjusted under 35 U.S.C. 154(b) by 231 days.

(21) Appl. No.: 12/845,989

(22) Filed: Jul. 29, 2010

(65) Prior Publication Data

US 2011/0030197 A1 Feb. 10, 2011

Related U.S. Application Data

(60) Provisional application No. 61/273,821, filed on Aug. 10, 2009.

(51) Int. Cl.
*G01R 31/28* (2006.01)

(52) U.S. Cl. ........... 29/593; 29/609.1; 29/831; 427/129; 427/130; 438/6; 438/15; 438/337; 438/462

(58) Field of Classification Search .................... 29/417, 29/592.1, 593, 594, 609.1, 831, 842, 846, 29/854; 324/754, 755, 758, 761, 765; 427/129, 427/130; 438/6, 15, 337, 462
See application file for complete search history.

(56) References Cited

U.S. PATENT DOCUMENTS

| | | | | |
|---|---|---|---|---|
| 3,621,484 | A * | 11/1971 | Shult | 333/202 |
| 4,029,386 | A | 6/1977 | Krantz et al. | 439/607.05 |
| 4,651,116 | A | 3/1987 | Schloemann | 333/235 |
| 5,629,266 | A * | 5/1997 | Lithgow et al. | 505/210 |
| 6,049,155 | A | 4/2000 | Graebner et al. | 310/313 |
| 6,060,966 | A | 5/2000 | Tennant et al. | 333/202 |
| 6,111,483 | A | 8/2000 | Haapakoski | 333/202 |
| 6,114,758 | A | 9/2000 | Anderson et al. | 257/686 |
| 6,392,506 | B2 | 5/2002 | Wulff et al. | 333/134 |
| 6,407,651 | B1 | 6/2002 | Wulff et al. | 333/224 |
| 6,466,111 | B1 | 10/2002 | Wulff | 333/222 |
| 6,600,394 | B1 | 7/2003 | Wang et al. | 333/235 |
| 6,809,612 | B2 | 10/2004 | Bloom et al. | 333/134 |
| 6,816,037 | B2 | 11/2004 | Hoffman | 333/202 |
| 6,914,785 | B1 | 7/2005 | Slocum et al. | 361/762 |
| 7,068,124 | B2 | 6/2006 | White et al. | 333/185 |
| 7,321,278 | B2 | 1/2008 | Vangala | 333/134 |
| 7,342,468 | B2 | 3/2008 | Lopez et al. | 333/202 |

(Continued)

FOREIGN PATENT DOCUMENTS

AT 434840 7/2009

(Continued)

OTHER PUBLICATIONS

S. Black, "New metal coating to optimize composite tooling", *High-Performance Composites*, pp. 76-79, May 2008.

(Continued)

*Primary Examiner* — Paul D Kim
(74) *Attorney, Agent, or Firm* — Ostrolenk Faber LLP

(57) ABSTRACT

A method is disclosed for the fabrication of a tunable radio frequency (RF) power output filter that includes fabricating a core body and then forming a plastically deformable metallic shell over the exterior surface of the core body.

16 Claims, 5 Drawing Sheets

U.S. PATENT DOCUMENTS

| | | | | |
|---|---|---|---|---|
| 7,388,458 | B2 | 6/2008 | Svensson et al. | 333/202 |
| 7,656,253 | B2 * | 2/2010 | Stokes et al. | 333/193 |
| 2001/0030587 | A1 | 10/2001 | Wulff et al. | 333/134 |
| 2004/0174236 | A1 | 9/2004 | Matthews | 333/206 |
| 2004/0212457 | A1 | 10/2004 | Eden et al. | 333/185 |
| 2005/0161751 | A1 | 7/2005 | Geisberger et al. | 257/414 |
| 2005/0162806 | A1 | 7/2005 | Sarkar et al. | 361/277 |
| 2005/0227428 | A1 | 10/2005 | Mihai et al. | 438/222 |
| 2005/0231304 | A1 | 10/2005 | White et al. | 333/185 |
| 2006/0006965 | A1 | 1/2006 | Ishii | 333/191 |
| 2006/0111070 | A1 | 5/2006 | Svensson et al. | 455/296 |
| 2006/0192634 | A1 | 8/2006 | Vangala | 333/134 |
| 2007/0001248 | A1 | 1/2007 | Geisberger et al. | 257/414 |
| 2008/0169995 | A1 | 7/2008 | du Toit et al. | 343/861 |
| 2010/0102902 | A1 | 4/2010 | Jung | 333/212 |

FOREIGN PATENT DOCUMENTS

| | | |
|---|---|---|
| AU | 2003234530 | 11/2003 |
| CA | 1065422 | 10/1979 |
| CN | 101636873 | 1/2010 |
| DE | 2707160 | 9/1977 |
| EP | 1614184 | 1/2006 |
| EP | 1856762 | 11/2007 |
| EP | 2118957 | 11/2009 |
| FR | 2341962 | 9/1977 |
| GB | 1521024 | 8/1978 |
| IL | 51427 | 3/1979 |
| IT | 1085861 | 5/1985 |
| JP | 2006521775 | 9/2006 |
| KR | 20060009827 | 2/2006 |
| KR | 100810971 | 3/2008 |
| WO | WO 03/094280 | 11/2003 |
| WO | WO 2004/093238 | 10/2004 |
| WO | WO 2006/098796 | 9/2006 |
| WO | WO 2008/111782 | 9/2008 |

OTHER PUBLICATIONS

R. Emrich et al., "Low frequency magnetic shielding: An integrated solution", *Interference Technology, EMC Directory & Design Guide 2009*, pp. 120-127, 2009.

D. Facchini et al., "Small Crystals, Big Benefits", www.pfonline.com, pp. 15-18, Apr. 2009.

"Dissipation factor." *Wikipedia, The Free Encyclopedia*. Wikimedia Foundation, Inc., Mar. 11, 2010.

"Dissipation Factor (DF)", *Basic Considerations: DF, Q, and ESR*, <http://www.cartage.org.lb>.

Notification of Transmittal of the International Search Report and The Written Opinion of the International Searching Authority dated Aug. 2, 2010, issued in corresponding International Application No. PCT/US2010/044075.

* cited by examiner

METHOD OF CONSTRUCTING A TUNABLE RF FILTER

CROSS REFERENCE TO RELATED APPLICATION AND CLAIM OF PRIORITY

The present application claims benefit of and priority to U.S. Provisional Patent Application No. 61/273,821 entitled METHOD OF CONSTRUCTING AN RF FILTER filed Aug. 10, 2009, the entire contents of which are hereby incorporated by reference.

FIELD OF THE INVENTION

The present invention is directed to a method of constructing a power output filter for a radio frequency (RF) application, for example, in the cellular band or the microwave band. A method according to the present invention could also be used to fabricate combined transmit and receive filters.

BACKGROUND OF THE INVENTION

Today, most RF output filters for the cellular frequency band are manufactured either by machining cavities in large blocks of aluminum or by die casting large aluminum parts. Both methods produce heavy and expensive RF filters. Also, both methods further require the machining of a cover for the cavity filter, which is attached to the base of the machined aluminum part with a significant number of screws to guarantee an effective RF seal thereby increasing the cost and complexity of the process. It may also be required to plate a thin layer of silver onto the aluminum to enhance the filter performance.

Another limitation of the conventional methods is the restriction imposed by conventional machining techniques, which typically require the cavity to have vertical walls with a radius along the bottom and side corners and a square corner (which is undesirable) where the cover seals to the top of the cavity.

SUMMARY OF THE INVENTION

It is an object of the present invention to reduce the cost and the complexity of the fabrication of an RF output filter.

The method for fabricating an RF filter that is disclosed herein eliminates the large and heavy aluminum body and its costly cover.

Specifically, the disclosed method includes fabricating a core body (for example, by molding or machining) preferably with a very low dissipation factor material, such as polystyrene plastic or polyethylene foam, and then forming a thin metallic body (for example, by plating) of a high strength metallic material over the exterior surface of the core body to obtain a metallic shell. The metallic shell surrounds the core body, thus eliminating the need for a cover.

Prior to forming the metallic body, any poles or input/output hardware could be assembled in the core body. Alternatively, the input/output parts could be assembled into the core body as inserts during the molding process.

Many different metals could be used for the plating process but one that is very dimensionally stable over temperature, such as a nickel steel alloy 64-FeNi (commonly known by the trademark INVAR) is preferred since it would create a metallic shell that is very dimensionally stable over a temperature range.

The metallic shell could include multiple layers of various materials and thicknesses, each imparting a key property at the desired location. For example, the first layer, which is in direct contact with the exterior surface of the core body, may be composed of a highly-conductive metal layer that includes, for example, silver or copper as a component thereof.

The core body could be created by using a material with a low loss tangent so it would be left in place after the metallic shell is formed. Alternatively, the molding material could be removed by dissolving it with an appropriate solvent after the metallic shell is formed.

To tune a filter that is fabricated according to the present invention the metallic shell thereof is plastically deformed (i.e. permanently deformed, or strained beyond its elastic limit) in a specific location or specific locations chosen to enhance the tenability of the filter.

Features can be designed into the metallic shell to render it locally compliant in a more predictable manner whereby it may be plastically deformed in a desired way without changing the overall configuration of the filter. The material for the fabrication of the metallic shell must be chosen to have an appropriate compliance to permit the localized plastic deformation. This approach would eliminate the need for tuning screws and would be very suitable for highly-automated manufacturing.

Filters that are fabricated according to the present invention would be significantly lighter and less costly. It should also be noted that a method according to the present invention could significantly reduce the complexity of filter designs and thus provide extensive design freedom for RF filter designers to design filters that are not possible and/or practical with traditional filter manufacturing methods. Thus, for example, the use of a core body will allow the filter designer to explore new and unique shapes for filter designs, which could not be fabricated by machining or die casting.

The manufacturability of core shapes is an important driver of filter designs today. Advantageously, a method according to the present invention may allow for the design of new filter shapes, which were previously excluded from consideration because of conventional manufacturing limitations.

It should be noted that the use of a method according to the present invention does not exclude the user from using the traditional approach of adding tuning screws to the filter.

Other features and advantages of the present invention will become apparent from the following description of the invention which refers to the accompanying drawings.

BRIEF DESCRIPTION OF THE DRAWINGS

For a more complete understanding of the present disclosure, reference is now made to the following descriptions taken in conjunction with the accompanying drawings, in which.

DETAILED DESCRIPTION OF EMBODIMENTS OF THE INVENTION

Figure 1:
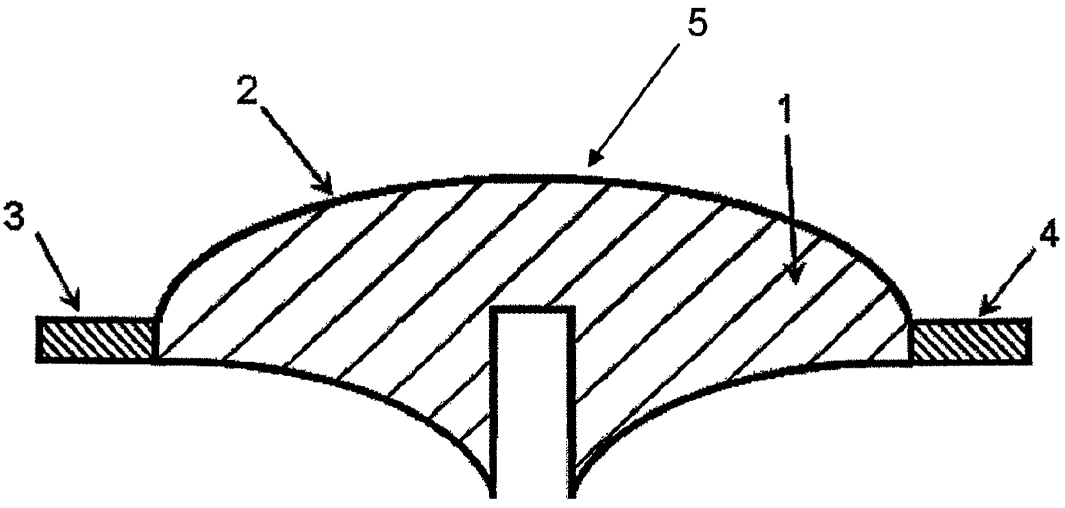
FIG. 1 depicts a cross-sectional view of an RF filter fabricated according to the present invention.

FIG. 1 depicts a cross-sectional view of an RF output filter 5 that is fabricated according to the present invention. RF output filter 5 may include a core body 1, which may be removable as further explained below, and a plastically deformable metallic shell 2 formed around and directly over the exterior surface of core body 1. Plastically deformable metallic shell 2 may include a layer of one metallic material, or two or more layers each composed of a different metallic material. The thickness and the material or materials used for forming metallic shell 2 may vary depending upon the actual design of filter 5. Note that, while FIG. 1 shows metallic shell 2 encasing core body 1, metallic shell 2 may include a perforation, or two or more perforations therein to provide access to the interior thereof. Such access may be used to remove core body 1, or used for the purpose allowing the mounting of connectors or the like to RF filter 5. FIG. 1 further shows an input port connector 3 and an output port connector 4 in contact with RF filter 5. While both input 3 and output 4 port connectors are shown in contact with metallic shell 2 of filter 5, one experienced in the design of RF filters will appreciate that an RF filter is typically composed of an arrangement of a plurality of filter shells.

To fabricate RF filter 5, core body 1 can be molded or machined out of a solid piece of plastic (solid refers here to the material as an element, and not to its intrinsic structure, which could in fact be a homogeneous solid or a foamed structure with air or other gas(es) filling open or closed cell pores in the foam). All of the required polls and input and output devices may be added to core body 1 at this time. Core body 1 may have a symmetric shape, or an asymmetric shape.

Thereafter, at least one layer of a metallic material is formed over the exterior surface of core body 1 by, for example, plating or the like method, to obtain a metallic shell 2 over the exterior surface of core body 1. Note that the thickness, and the inherent mechanical properties of the metallic material forming metallic shell 2 should be selected to allow for (a) suitable mechanical integrity of metallic shell 2, and (b) plastic mechanical deformation of metallic shell 2 with the application of 10 pounds to 40 pounds if the thickness of the metallic shell is between 200-6000 micro-inches, which will allow for filter plating to be completed in a reasonably economic time. Thicker plating can be obtained if it is required for specifically-desired mechanical properties.

Thereafter, optionally, core body 1 may be removed. For example, core body 1 may be dissolved using a suitable solvent and washed out of the interior space surrounded by metallic shell 2. In order to render RF filter 5 suitable for use with a selected frequency, RF filter 5 is then deformed plastically whereby it is tuned to the selected frequency.

In a conventional filter, a tuning screw is used to tune the RF filter in order to change the physical geometry and adjust the capacitance between different parts thereof. In an RF filter fabricated according to the present invention a tuning screw may also be used to attain the desired changes to tune the RF filter to a desired frequency. Alternatively, the filter can be tuned by driving a tapered rod into a pre-positioned hole in the filter to change the geometry of the cavity.

Figure 2A:
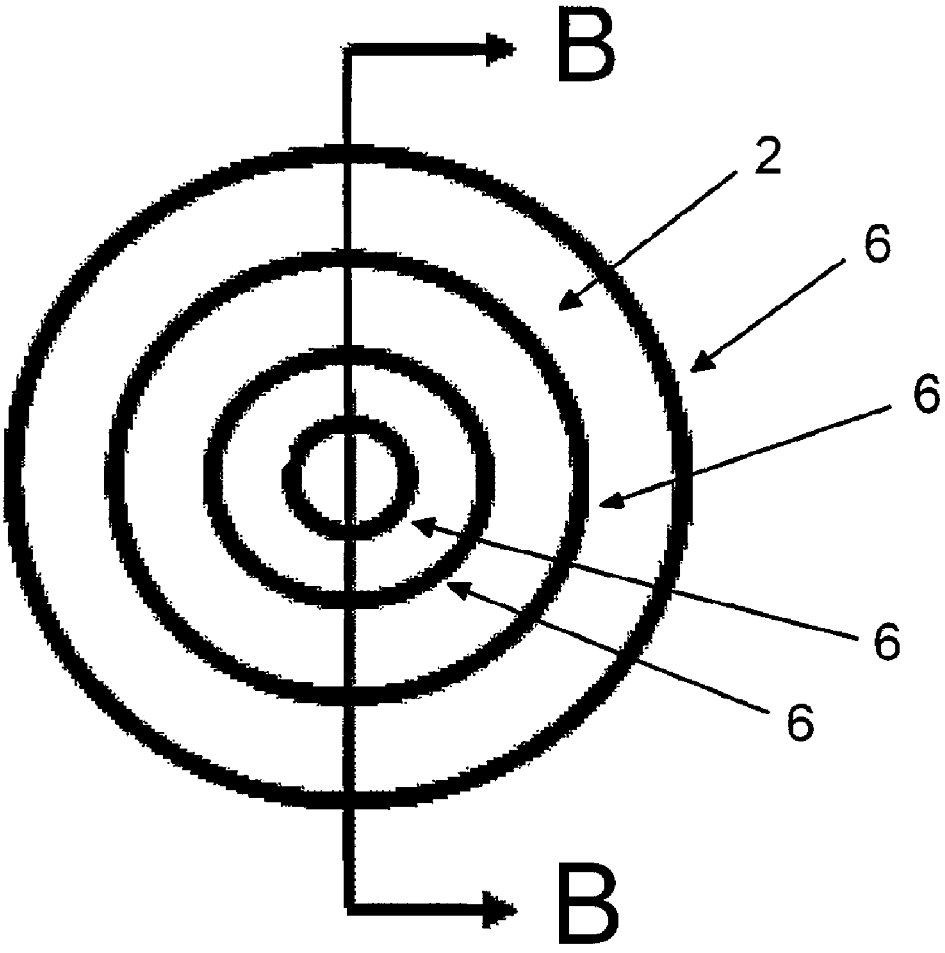
FIG. 2A depicts a top plan view of an RF filter fabricated according to the present invention that includes further features to facilitate its plastic deformation.
Figure 2B:
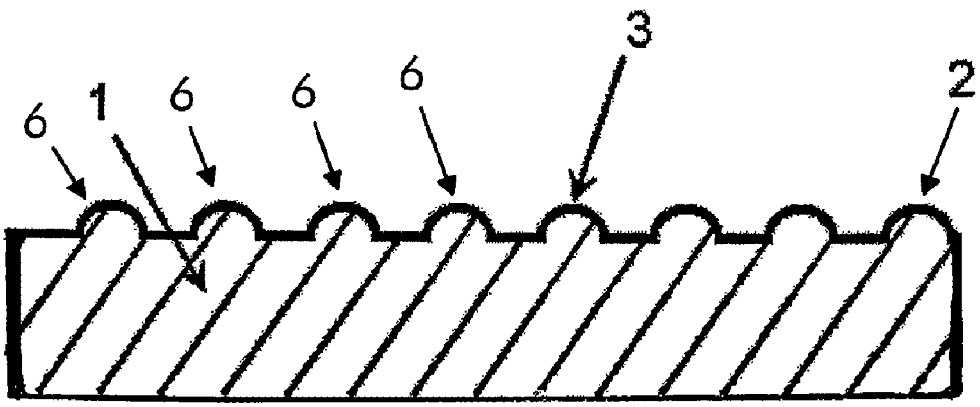
FIG. 2B depicts a cross-sectional view along line B-B of FIG. 2A viewed in the direction of the arrows.

Referring now to FIGS. 2A and 2B, in order to facilitate the plastic deformability of an RF filter 5, a relief pattern may be provided on an exterior surface of core body 1. For example, the relief pattern may be a plurality of concentric rings. Thus, when core body 1 is plated according to the present invention a metallic shell 2 is obtained that includes a plastically deformable bellows arrangement of a plurality of concentric, circular ridges 6. The bellows arrangement serves to render metallic shell 2 more compliant. Naturally, other shapes that can render metallic shell 2 more compliant are also possible by the proper provision of suitable features on the exterior surface of core body 1. As is evident, the method described herein allows for the design and fabrication of filters with filter core configurations that would be difficult if not impossible to machine with conventional machining methods, such as complex surface profiles that vary continuously in 3 directions, narrow and curved passages, and the like.

Figure 3:
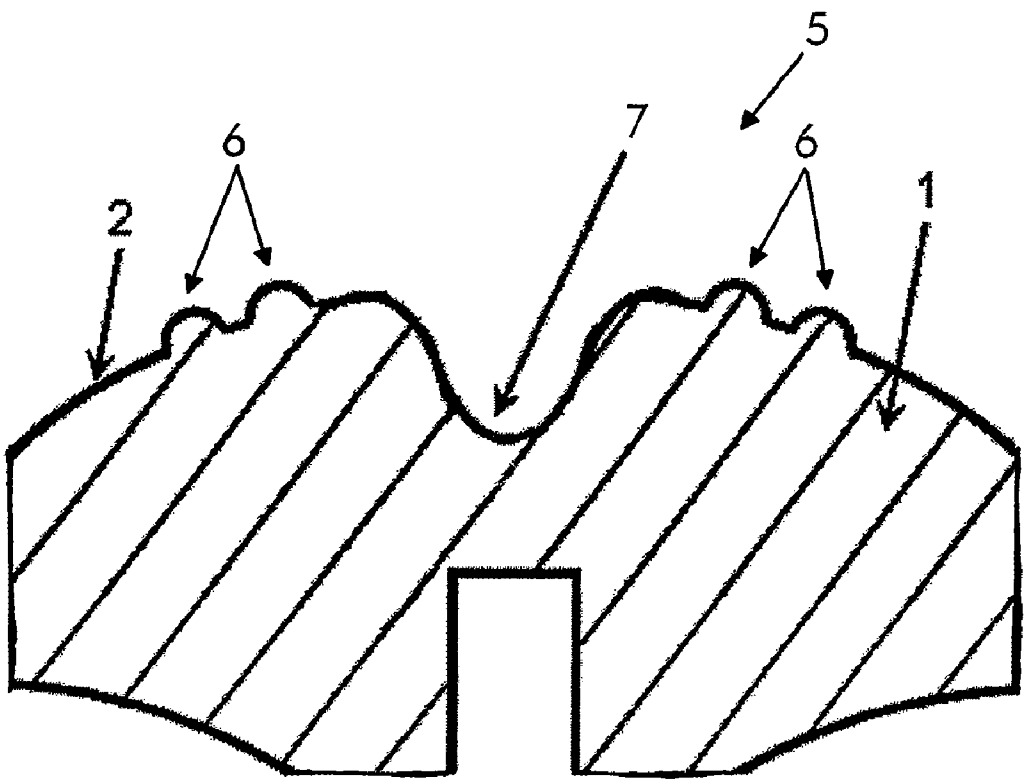
FIG. 3 is a cross-sectional view of the RF filter of FIG. 2A after tuning.

FIG. 3 shows a cross-sectional view of an RF filter according to FIGS. 2A and 2B after it has been plastically deformed according to the present invention. In order to tune the filter, metallic shell 2 can be plastically deformed by pushing a rod in the center thereof. The depth of the plastic deformation can be determined by measuring the electrical properties of the cavity. Note that RF filter 5 includes tuning feature 7, which is that portion of metallic shell 2 that has been plastically deformed to tune the filter.

Figure 4:
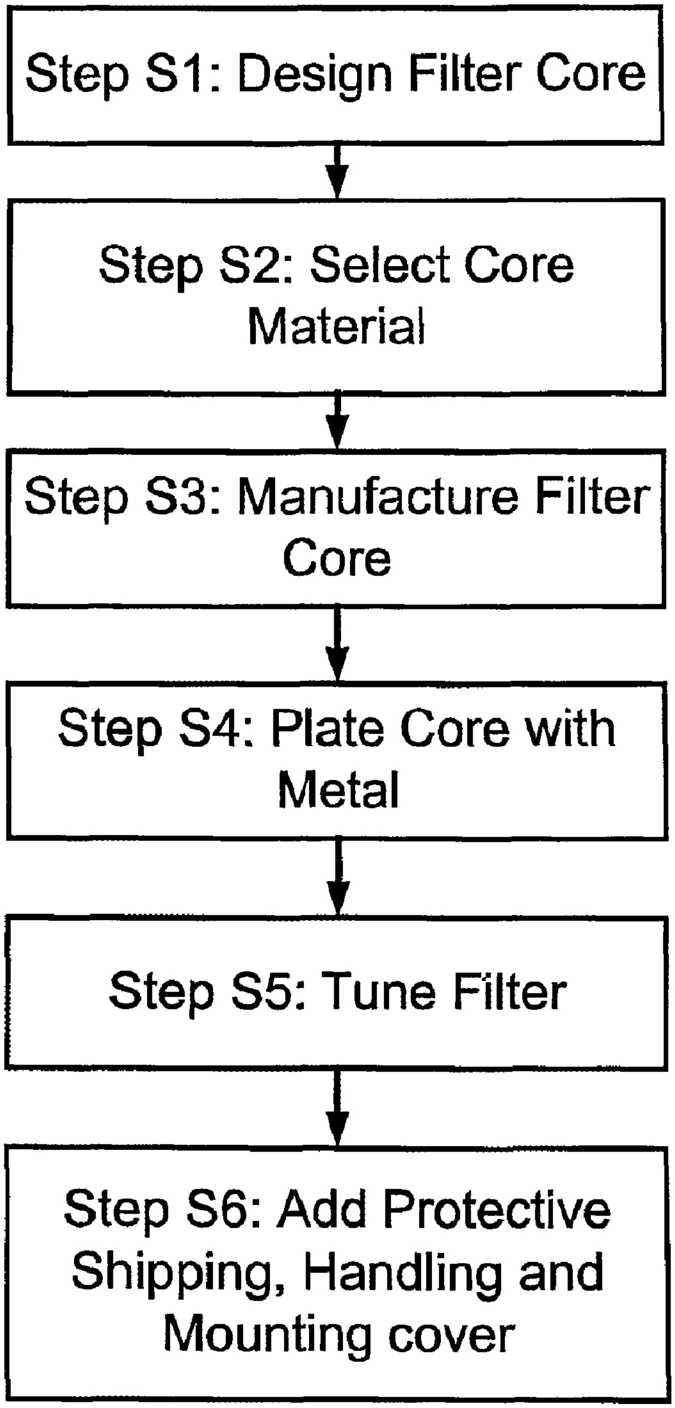
FIG. 4 shows the steps in a method according to an embodiment of the present invention.

FIG. 4 illustrates a flow diagram for the implementation of a method according to one embodiment of the present invention. This flow diagram lays out the steps for the fabrication of an RF output filter using a low loss material. Low loss material refers to a material having a loss tangent (δ) as close to air (loss tangent=0) or vacuum as possible. Loss tangent, sometimes referred to as dielectric dissipation factor, is typically expressed as the decimal ratio of the irrecoverable to the recoverable part of the electrical energy introduced into a dielectric material by the establishment of an electric field in the material. Modern Dictionary of Electronics, Rudolf F. Graf, Howard W. Sams & Co., Inc., Indianapolis, Ind. (1977). Loss tangent is a parameter of a dielectric material that quantifies its inherent capacity to dissipate electromagnetic energy. More specifically, the term refers to the angle in a complex plane between the resistive (loss) component of an electromagnetic field and its reactive (lossless) component. The loss tangent of a material is also a function of the frequency of the RF-energy being filtered. So, the choice of material will also depend in part on the frequency range of operation of the filter. Loss tangent, δ, is related to dissipation factor DF by the following equation:

$$\tan \delta = DF$$

In a good capacitor DF is usually small. Therefore, $\delta \simeq DF$ in a good capacitor. DF is usually expressed as a percentage and varies depending on the material and frequency of the applied signal. In a low dielectric constant material, DF should be between 0.1% to 0.2%, and in a high dielectric constant material DF can be between 1% to 2%. A low loss tangent material suitable for a filter fabricated according to the present invention should have a DF in the range of 0.1%-2%. At Design Filter Core step, S1, the designer would layout the filter cavities based upon the filter requirements. It should be noted that the designer will have much more freedom in picking the physical layout of the cavities, since the low loss core will allow the use of much more complicated geometries than the traditional machining or die casting approaches used in today's filters.

Once the filter design is completed, the core material will be selected at step S2. A suitable low loss material can be a plastic material like polystyrene foam or polyethylene foam. Experimental data provided by manufacturers indicate that these foams have a loss tangent close to that of air or vacuum. Table 1 provides loss tangents for a few low loss tangent materials.

TABLE 1

| | |
|---|---|
| polystyrene, cross-linked | $2 \times 10^{-4}$ (at 100 MHz) |
| polystyrene, glass microfiber | $4 \times 10^{-4}$ (at 100 MHz) |
| polystyrene | $1 \times 10^{-4}$ (at 100 MHz) |
| polyethylene, DE-3401 | $2 \times 10^{-4}$ (at 100 MHz) |

TABLE 1-continued

| | |
|---|---|
| polystyrene, cross-linked | $7 \times 10^{-4}$ (at 10 GHz) |
| polystyrene, glass microfiber | $2 \times 10^{-3}$ (at 10 GHz) |
| polystyrene | $3.1 \times 10^{-4}$ (at 3 GHz) |
| polyethylene, DE-3401 | $3.3 \times 10^{-4}$ (at 3 GHz) |

The data provided are approximations. A skilled person would understand that actual loss tangent for a material may vary from manufacturer to manufacturer. Also, it should be noted that the data is for solid materials and that a foam may have a considerably smaller loss tangent.

The selection of the material for core body 1 will depend upon how much of a loss tangent the design can tolerate. Next core body 1 will be fabricated in step S3. Methods such as machining or molding can be used to fabricate core body 1. The choice of approach will depend upon the volume of filters to be manufactured. During the manufacturing of core body 1 the input/output and any poll hardware can be added to core body 1.

At step S4, core body 1 can be plated with a metallic material to a thickness that allows the filter to operate and also remain stable over its operating temperature. One suitable plating material is a nickel steel alloy 64-FeNi (commonly known by the trademark INVAR) because of it excellent mechanical properties and stability over temperature. Other suitable materials may be used without deviating from the scope and spirit of the present invention. For example, a material with properties similar to INVAR, that is available from Integran Technologies, Inc. of Toronto, Canada, is Nanovate N2035. Some designs may include two layers of plating to get the desired RF performance. In such a design, one layer may be composed of a metallic material with a lower bulk electrical resistivity, and weaker mechanical properties than the other. For example, a highly conductive material (e.g. copper or silver) can be plated over core body 1 and then a high strength metallic material (e.g. INVAR) can be plated on top of the conductive material. Alternatively, the order of the metallic layers may be reversed, namely, the high strength metallic material (e.g. INVAR) may be plated first over core body 1 and then the highly conductive metallic material (e.g. copper) may be plated.

At step S5, Tune Filter, the final RF input and output connectors can be added and the RF filter is tuned. The tuning process can either be carried out using the traditional adjustment screws or by using the new technique of plastic deformation of the filter wall as described above.

At step S6 the tuned RF filter is covered with a protective material to protect it from shipping, handling and in-use damage. It is envisioned that the completed filter could be placed into a low-cost metal or plastic housing which contains integral mounting features for the filter in its intended, installed location. The volume between the outside of the plated filter wall and the inside of the housing could be filled with a low cost, low weight, and compliant material to provide the needed protection as well as the desired thermal properties.

Alternatively, the material for forming core body 1 may be a high loss tangent material, which can be removed once the plating process is completed. The removal of the core material can be accomplished by using an appropriate solvent for the chosen core material. The flushing operation could make use of the ports formed for the input and output RF connectors as a means to introduce the solvent as well as to drain the flushing solution. A high loss tangent material refers to a material that exhibits a loss tangent that is substantially more than that of air or vacuum, which cannot be considered a low loss material.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for fabrication of a radio frequency (RF) filter comprising:
- fabricating a core body having an exterior surface capable of receiving a metallic material;
- forming a layer of said metallic material over said exterior surface of said core body and around said core body, said layer being configured to be plastically deformable; and
- plastically deforming said layer of said metallic material to tune said RF filter to a desired frequency.

2. The method of claim 1, wherein said core body is comprised of a low loss tangent material.

3. The method of claim 1, wherein said core body is comprised of one of polystyrene plastic or polyethylene foam.

4. The method of claim 1, further comprising removing said core body after said forming step.

5. The method of claim 1, further comprising forming another layer of another metallic material over said layer of said metallic material before plastically deforming said layer of said metallic material.

6. The method of claim 5, wherein said metallic material has a higher electrical resistivity than said another metallic material.

7. The method of claim 6, wherein said metallic material is comprised of INVAR and said another metallic material is comprised of copper.

8. The method of claim 5, wherein said metallic material has a lower electrical resistivity than said another metallic material.

9. The method of claim 8, wherein said another metallic material is comprised of INVAR.

10. The method of claim 5, wherein said layer of said metallic material is formed by plating and said another layer of said another metallic material is formed by plating.

11. The method of claim 1, wherein said core material is comprised of either a low loss tangent material or a high loss tangent material.

12. The method of claim 1, wherein said layer of said metallic material is formed by plating.

13. The method of claim 1, wherein said core body is provided with a relief pattern on said exterior surface thereof.

14. The method of claim 13, wherein said relief pattern is comprised of a plurality of concentric circular rings.

15. The method of claim 1, wherein said core body is symmetric or asymmetric.

16. The method of claim 1, wherein said RF filter is suitable for a radio frequency (RF) application in a cellular band or a microwave band.

* * * * *